United States Patent

Lee et al.

[11] Patent Number: 6,089,315
[45] Date of Patent: Jul. 18, 2000

[54] COMPOSITE HEAT SINK

[75] Inventors: Shun-Jung Lee, Pan-Chiao; Hsieh-Kun Lee, Chung-Ho, both of Taiwan

[73] Assignee: Hon Hai Precision Ind. Co., Ltd., Taipei Hsien, Taiwan

[21] Appl. No.: 09/335,935

[22] Filed: Jun. 18, 1999

[30] Foreign Application Priority Data

Dec. 4, 1998 [TW] Taiwan ................................. 87220289

[51] Int. Cl.$^7$ ...................................................... F28F 7/00
[52] U.S. Cl. ...................... 165/185; 165/80.3; 361/697; 361/704; 174/16.3; 257/719
[58] Field of Search .................... 165/185, 80.3, 165/80.2; 361/697, 704, 694, 695, 707, 709, 710, 715, 718, 722; 174/16.3; 257/718, 719, 727

[56] References Cited

U.S. PATENT DOCUMENTS

| | | | |
|---|---|---|---|
| 5,437,328 | 8/1995 | Simons | 165/185 |
| 5,706,169 | 1/1998 | Yeh | 165/80.3 |
| 5,771,153 | 7/1998 | Sheng | 361/697 |
| 5,864,464 | 1/1999 | Lin | 361/697 |
| 5,870,288 | 2/1999 | Chen | 165/80.3 |
| 5,884,692 | 3/1999 | Lee et al. | 165/80.3 |
| 5,927,385 | 7/1999 | Yeh | 165/80.3 |
| 5,943,210 | 8/1999 | Lee et al. | 361/697 |
| 5,947,192 | 9/1999 | Kuo | 165/80.3 |
| 5,973,921 | 10/1999 | Lin | 361/697 |
| 6,025,994 | 2/2000 | Chiou | 165/185 |

*Primary Examiner*—Ira S. Lazarus
*Assistant Examiner*—Terrell McKinnon
*Attorney, Agent, or Firm*—Wei Te Chung

[57] ABSTRACT

A heat sink includes a base plate having a bottom face adapted to be positioned on an electronic device to remove heat therefrom and a top face on which a central fin assembly and two end fin assemblies are fixed by means of screws. The central fin assembly is located between the end fin assemblies and a space is defined between the central fin assembly and each end fin assembly for receiving a clip to secure the heat sink to the electronic device. The central fin assembly has a number of fins defining passages therebetween through which air flows. Each end fin assembly has a number of fins defining passages therebetween through which air flows. The number of fins of the central fin assembly is greater than that of the end fin assemblies whereby the central fin assembly has a larger surface area for facilitating heat dissipation, while the end fin assemblies have larger passages for reducing resistance to air flowing therethrough. Preferably, the number of passages of the central fin assembly is a multiple of that of the end fin assemblies whereby each passage of the end fin assemblies is aligned with a number of passages of the central fin assembly for facilitating smooth air flow therebetween.

13 Claims, 4 Drawing Sheets

COMPOSITE HEAT SINK

BACKGROUND OF THE INVENTION

1. Field of the Invention

The present invention generally relates to a heat sink for removing heat from an electronic device, such as a computer central processing unit, and in particular to a composite heat sink which enhances air flow circulation and increases surface area for facilitating heat dissipation.

2. The Prior Art

With the rapid development of the electronics industry, the speed of electronic devices has increased considerably resulting in a large amount of heat generated during operation of the device. The heat must be properly dissipated in order to maintain an acceptable operation temperature of the device. To enhance heat removal, a heat sink is often attached to the electronic device. Examples of heat sinks are disclosed in U.S. Pat. Nos. 5,621,615 and 5,630,469 which comprise a base from which a number of fins extend. The base is directly mounted to an electronic device for conducting heat from the electronic device to the fins where heat transfer due to convection and radiation results.

The conventional heat sink, however, has a limited efficiency when removing heat from an electronic device. Thus, a more efficient heat sink is requisite.

SUMMARY OF THE INVENTION

Accordingly, an object of the present invention is to provide an efficient heat sink which has a composite structure for enhancing air flow and increasing surface area thereby facilitating heat dissipation.

To achieve the above object, a heat sink in accordance with the present invention comprises a bottom face adapted to be positioned on an electronic device to remove heat therefrom and a top face on which a central fin assembly and two end fin assemblies are fixed by means of screws. The central fin assembly is located between the end fin assemblies and a space is defined between the central fin assembly and each end fin assembly for receiving a clip to secure the heat sink to the electronic device. The central fin assembly has a number of fins defining passages therebetween through which air flows. Each end fin assembly has a number of fins defining passages therebetween through which air flows. The number of fins of the central fin assembly is greater than that of the end fin assemblies whereby the central fin assembly has a larger surface area for facilitating heat dissipation, while the end fin assemblies have larger passages for reducing resistance to air flowing therethrough. Preferably, the number of passages of the central fin assembly is a multiple of that of the end fin assemblies whereby each passage of the end fin assemblies is aligned with a number of passages of the central fin assembly for facilitating smooth air flow therebetween.

BRIEF DESCRIPTION OF THE DRAWINGS

The present invention will be apparent to those skilled in the art by reading the following description of preferred embodiments thereof, with reference to the accompanying drawings, in which.

DETAILED DESCRIPTION OF THE PREFERRED EMBODIMENTS

Figure 1:
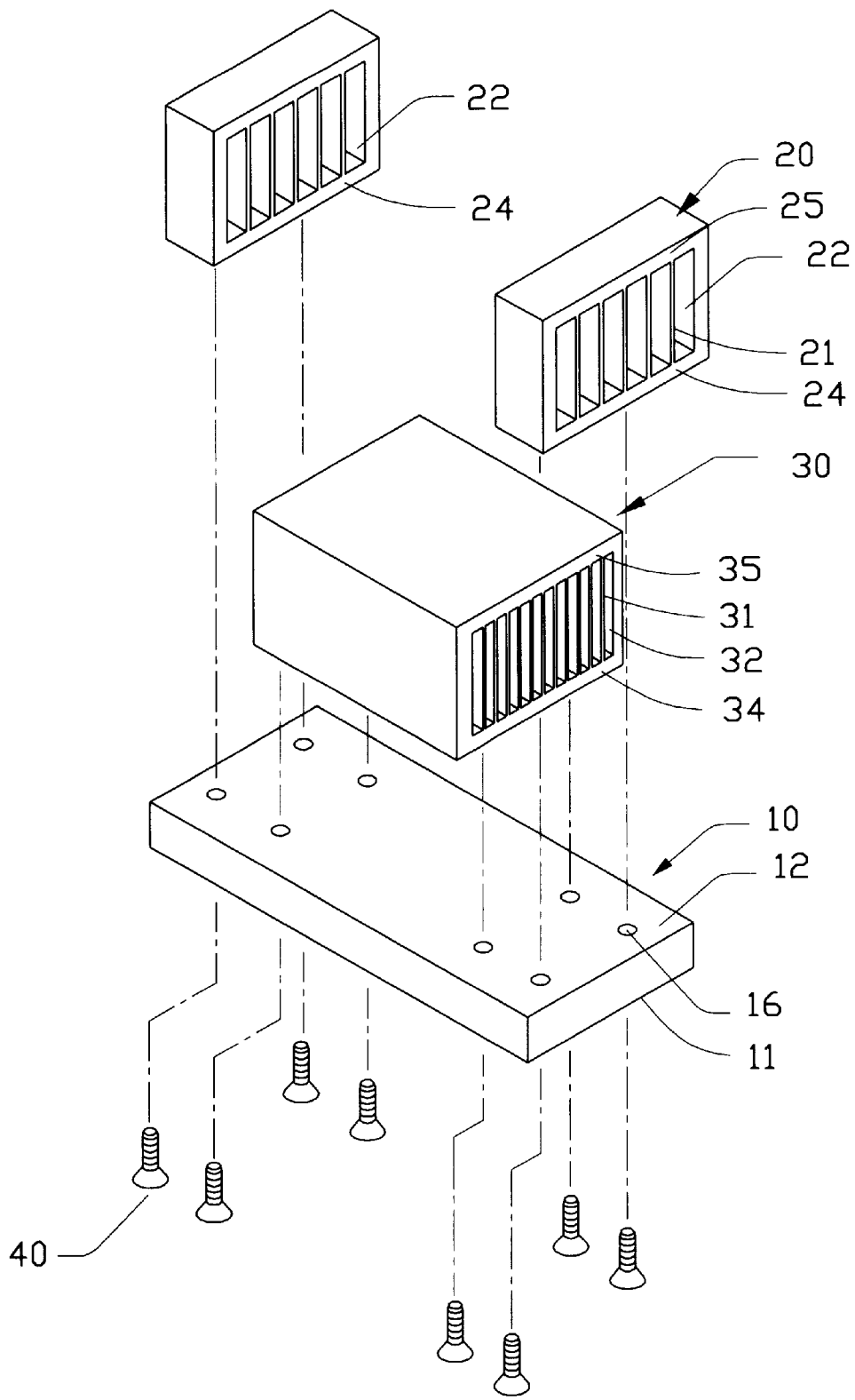
FIG. 1 is an exploded view of a heat sink in accordance with the present invention.
Figure 2:
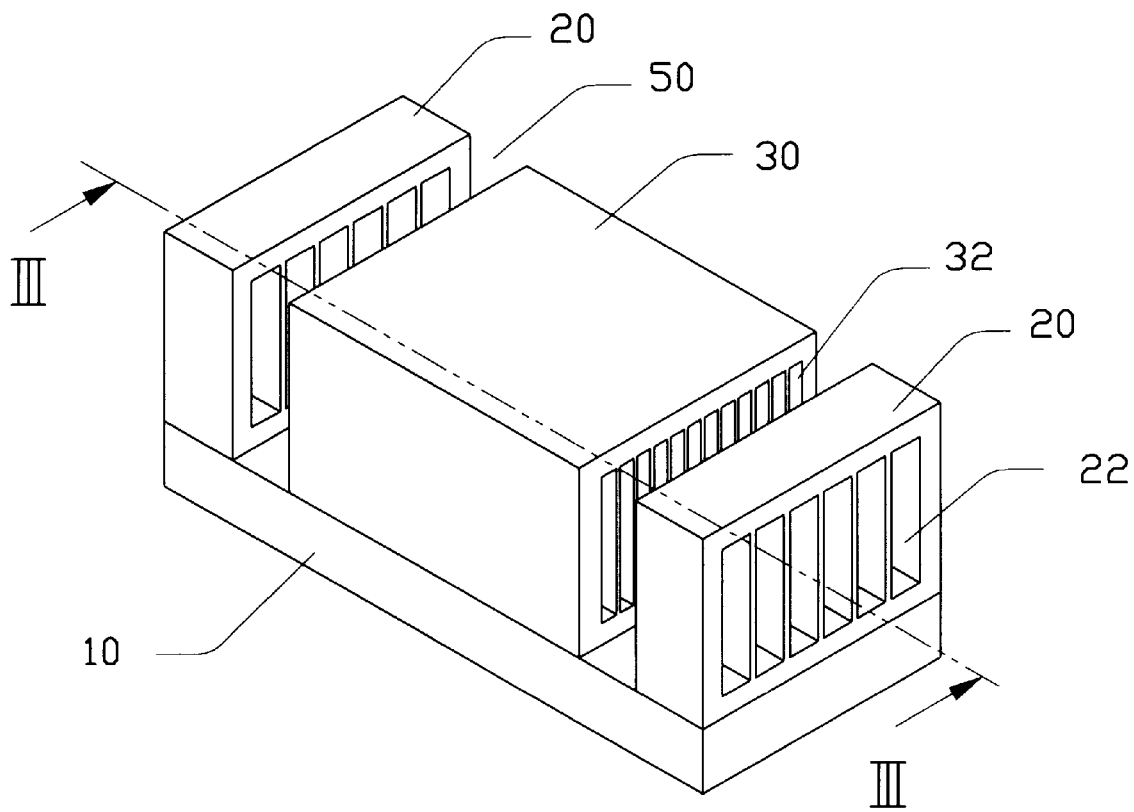
FIG. 2 is an assembled view of FIG. 1.

Referring to the drawings and in particular to FIGS. 1 and 2, a heat sink constructed in accordance with the present invention comprises a base plate 10 having a bottom face 11 adapted to be positioned on and in direct contact with an electronic device (not shown), such as a computer central processing unit, from which heat is to be removed, and a top face 12 on which a central fin assembly 30 is mounted. Two end fin assemblies 20 are also mounted to the top face 12 of the base plate 10 proximate opposite longitudinal ends of the central fin assembly 30.

The central fin assembly 30 comprises a bottom wall 34 positioned on the top face 12 of the base plate 10 and a plurality of fins 31 extending from the bottom wall 34. The fins 31 are spaced from each other a predetermined first distance to define a plurality of first passages 32 therebetween. The central fin assembly 30 also comprises a top wall 35 with top ends of the fins 31 being fixed thereto.

Each end fin assembly 20 comprises a bottom wall 24 positioned on the top face 12 of the base plate 10 and a plurality of fins 21 extending from the bottom wall 24. The fins 21 are spaced from each other a predetermined second distance to define a plurality of second passages 22 therebetween. The end fin assembly 20 also comprises a top wall 25 with top ends of the fins 21 being fixed thereto.

Figure 3:
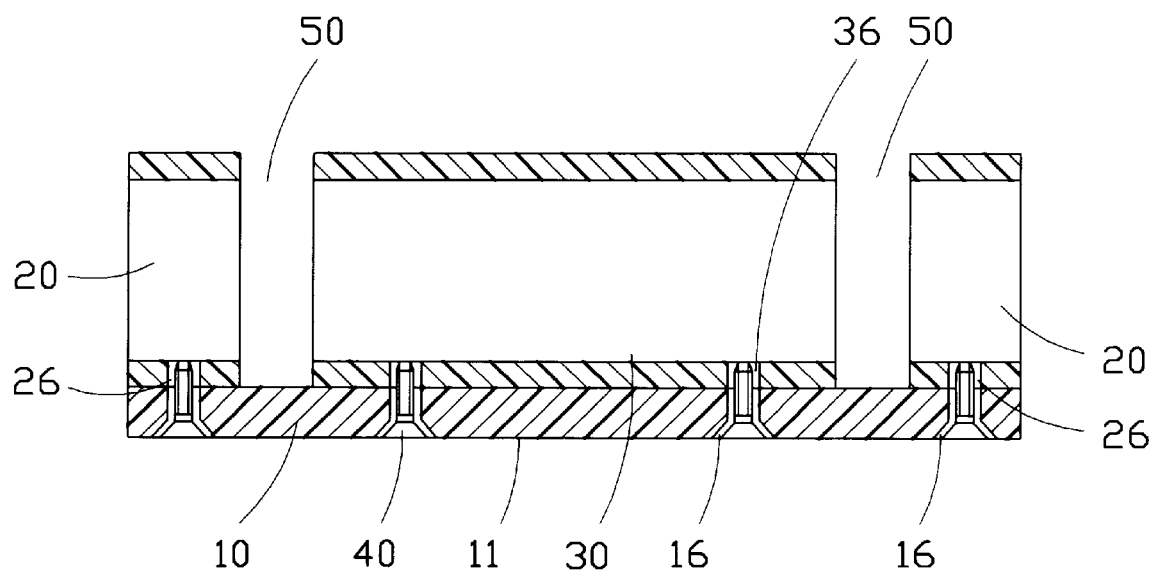
FIG. 3 is a cross-sectional view taken along line III—III of FIG. 2.

Referring also to FIG. 3, the central and end fin assemblies 30, 20 are fixed to the top face 12 of the base plate 10 by means of fasteners, such as screws 40. The screws 40 extend through holes 16 defined in the base plate 10 and engage with screw holes 26, 36 defined in the bottom walls 24, 34 of the end and central fin assemblies 20, 30 for securing the end and central fin assemblies 20, 30 to the base plate 10. Preferably, the through holes 16 have countersinks in order to provide surface contact between the bottom face 11 of the base plate 10 and the electronic device.

To avoid the formation of a gap between the top face 12 of the base plate 10 and the bottom walls 24, 34 of the end and central fin assemblies 20, 30, a thermal conductive material may be additionally provided therebetween. The thermal conductive material may be thermal grease or thermal tape.

The second distance between adjacent fins 21 of the end fin assembly 20 is a multiple of the first distance between adjacent fins 31 of the central fin assembly 30. For example, the second distance may be two or three times the first distance. In other words, the number of first passages 32 is two or three times that of the second passages 22 of the end fin assembly 20. Thus, two or three first passages 32 are aligned with each second passage 22 of each end fin assembly 20 and a smooth air flow from the second passages 22 to the first passages 32 is obtained.

Since the number of the first passages 32 is a multiple of that of the second passages 22, the number of the fins 31 of the central fin assembly 30 is also a multiple, at least substantially, of that of the end fin assemblies 20. Thus, the total surface area of the central fin assembly 30 is increased thereby increasing the amount of heat transferred from the fins 31 through the passages 32 by means of convection and radiation.

Furthermore, a reduced number of the second passages 22 exhibits less resistance for air to flow therethrough thereby facilitating heat dissipation.

Preferably, a space 50 is defined between each end fin assembly 20 and the central fin assembly 30 for receiving a clip (not shown) which secures the heat sink to the electronic device.

Figure 4:
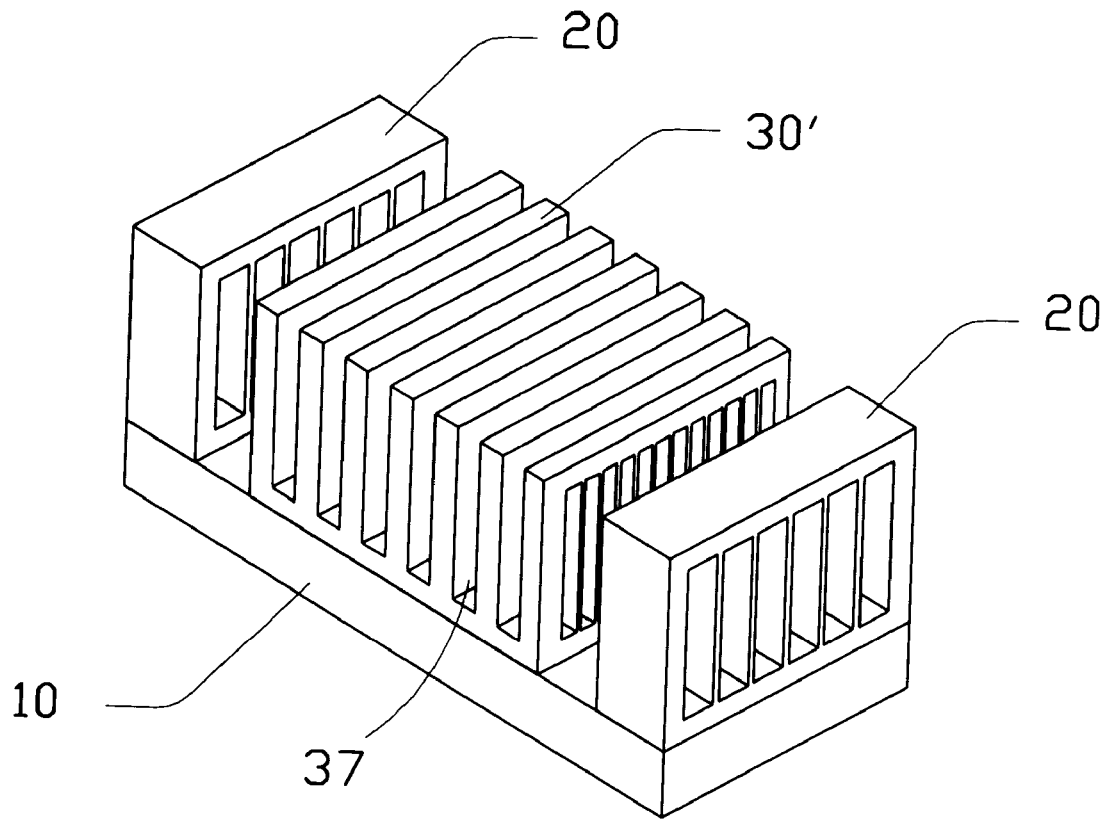
FIG. 4 is a perspective view of a heat sink in accordance with another embodiment of the present invention.

In another embodiment of the present invention, the central fin assembly, designated by reference numeral 30' for distinction, is provided with transverse channels 37 as shown in FIG. 4. The transverse channels 37 facilitate air circulation and also increase the total surface area of the central fin assembly 30'. Both lead to an increased efficiency of heat transfer away from the central fin assembly 30'.

Although the present invention has been described with reference to preferred embodiments, it is apparent to those skilled in the art that a variety of modifications and changes may be made without departing from the scope of the present invention which is intended to be defined by the appended claims.

What is claimed is:

1. A heat sink comprising:
   a base having a bottom face adapted to be positioned on and in direct contact with a device which generates heat and a top face;
   a central fin assembly mounted to the top face of the base, the central fin assembly comprising a first number of fins spaced from each other a first distance for defining a first number of passages therebetween through which air flows; and
   two end fin assemblies mounted to the top face of the base proximate opposite longitudinal ends of the central fin assembly, each end fin assembly comprising a second group of fins spaced from each other a second distance for defining a second number of passages therebetween through which air flows, the first number of fins being greater than the second number of fins, said first fin distance being smaller than said second distance, said second number of passages thus being larger than said first number of passages.

2. The heat sink as claimed in claim 1, wherein each of the central and end fin assemblies has a bottom wall from which the fins extend, the bottom wall being fixed to the top face of the base.

3. The heat sink as claimed in claim 2, wherein each of the central and end fin assemblies further comprises a top wall fixed to top ends of the fins.

4. The heat sink as claimed in claim 2, wherein the base defines through holes therein, and wherein the bottom wall of each of the central and end fin assemblies defines screw holes corresponding to the through holes of the base, screws being received in the through holes of the base and threadingly engaging with the screw holes of the bottom walls of the central and end fin assemblies for fixing the central and end fin assemblies to the base.

5. The head sink as claimed in claim 4, wherein the through holes of the base comprise a countersink on the bottom face thereof.

6. The heat sink as claimed in claim 1, wherein the second number is a multiple of the fourth number.

7. The heat sink as claimed in claim 6, wherein the second number is twice the fourth number.

8. The heat sink as claimed in claim 1, wherein a thermal conductive material is provided between the bottom walls of the central and end fin assemblies and the top face of the base to prevent the formation of a gap therebetween.

9. The heat sink as claimed in claim 8, wherein the thermal conductive material is thermal grease.

10. The heat sink as claimed in claim 8, wherein the thermal conductive material is thermal tape.

11. The heat sink as claimed in claim 1, wherein a space is defined between the central fin assembly and each of the end fin assemblies.

12. The heat sink as claimed in claim 1, wherein the central fin assembly defines a plurality of transverse channels for facilitating air circulation.

13. A heat sink comprising a base defining a longitudinal direction and lateral direction, at least a first fin assembly and a second fin assembly spaced from each other positioned on the base along said longitudinal direction, and each of said first fin assembly and said second fin assembly including a plurality of fins side by side spaced from each other in said transverse direction, wherein the first fin assembly is disposed in a relatively outer position in comparison with the second fin assembly, and has a smaller number of the fins thereof than the second fin assembly while with a larger distance between every adjacent two fins than the second fin assembly.

* * * * *